(12) United States Patent
Hung et al.

(10) Patent No.: US 7,408,245 B2
(45) Date of Patent: Aug. 5, 2008

(54) IC PACKAGE ENCAPSULATING A CHIP UNDER ASYMMETRIC SINGLE-SIDE LEADS

(75) Inventors: Chia-Yu Hung, Hsinchu (TW); Chao-Hsiang Leu, Hsinchu (TW); Tseng-Shin Chiu, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 40 days.

(21) Appl. No.: 11/643,860

(22) Filed: Dec. 22, 2006

(65) Prior Publication Data
US 2008/0150100 A1     Jun. 26, 2008

(51) Int. Cl.
*H01L 23/495* (2006.01)

(52) U.S. Cl. .................. 257/666; 257/686; 257/676

(58) Field of Classification Search .............. 257/686, 257/777, 784, 787, 666, 676
See application file for complete search history.

(56) References Cited

U.S. PATENT DOCUMENTS

| | | | | |
|---|---|---|---|---|
| 6,476,474 | B1* | 11/2002 | Hung | 257/686 |
| 6,498,391 | B1 | 12/2002 | Huang et al. | |
| 6,747,344 | B2* | 6/2004 | Corisis et al. | 257/668 |
| 2002/0113305 | A1* | 8/2002 | Huang | 257/690 |
| 2003/0214019 | A1* | 11/2003 | Chong et al. | 257/666 |
| 2005/0110727 | A1* | 5/2005 | Shin | 345/76 |
| 2006/0118924 | A1* | 6/2006 | Corisis et al. | 257/666 |
| 2007/0246807 | A1* | 10/2007 | Hara et al. | 257/666 |

FOREIGN PATENT DOCUMENTS

TW     404030     9/1989

* cited by examiner

*Primary Examiner*—S. V Clark
(74) *Attorney, Agent, or Firm*—Troxell Law Office, PLLC

(57) ABSTRACT

A multi-chip IC package encapsulates a chip under asymmetric longer single-side leads. The package mainly comprises a plurality of leads that have asymmetric length at two sides of a leadframe, a plurality of die-attach tape strips, a first chip having a plurality of single-side pads under the longer side leads, at least a second chip disposed above the longer side leads, a plurality of bonding wires and a molding compound. The die-attach tape strips are mutually parallel and adhered onto the lower surfaces of the longer side leads to adhere the first chip. There is at least a mold-flow channel formed through the first chip, the longer side leads and the die-attach tape strips. The bonding wires electrically connect the single-side pads of the first chip to the leads at the two sides of the leadframe through a non-central gap. The molding compound encapsulates the first chip, the second chip, the bonding wires and portions of the leads at the two sides of the leadframe and fills up the mold-flow channel. The mold-flow channel formed by means of the die-attach tape strips may increase the encapsulated area of the first chip by the molding compound to enhance product reliability of semiconductor package.

12 Claims, 5 Drawing Sheets

IC PACKAGE ENCAPSULATING A CHIP UNDER ASYMMETRIC SINGLE-SIDE LEADS

FIELD OF THE INVENTION

The present invention is relating to a multi-chip package wire-bonded at single-side, more particularly to an IC package encapsulating one of chips under asymmetric single-side leads.

BACKGROUND OF THE INVENTION

In general, multi-chip package is an important task for entire semiconductor fabricating technique and there may be many kinds of packages in accordance with various chips. For example, the pads of chip should be ranged in array for flip chip packaging process. In case of conventional wire-bonding chip package, the bonding pads of chip should be ranged at periphery of an active surface. Therein, a chip suitable for wire-bonding to connect has bonding pads ranged in single-side, two-side such as in "L" shape or "I I" shape, or four-side disposition. However, while proceeding multi-chip packaging process, the chip having bonding pads in asymmetric disposition will encounter difficulties in encapsulating processes.

Referring to FIG. 1, a well-known multi-chip package 100 comprises a substrate 110, a first chip 120, a second chip 130, a plurality of first bonding wires 141, a plurality of second bonding wires 142, a molding compound 150 and a plurality of external terminals 160. The first and second chips 120, 130 have bonding pads in asymmetric disposition respectively, there are a plurality of single-sided pads 122 disposed on one side of the active surface 121 of the first chip 120 and a plurality of single-sided pads 132 disposed on one side of the active surface 131 of the second chip 130.

The substrate 110 has an upper surface 111 and a lower surface 112, the first chip 120 is disposed on the upper surface 111 and the second chip 130 is stacked on the first chip 120 in a manner that the second chip 130 will not to cover the single-side pads 122 of the first chip 120. The first bonding wires 141 are applied for electrically connecting the single-side pads 122 of the first chip 120 to the substrate 110 and the second bonding wires 142 are also applied for electrically connecting the single-side pads 132 of the second chip 130 to the substrate 110. The molding compound 150 is formed over the upper surface 111 of the substrate 110 to encapsulate the first chip 120, the second chip 130, the first bonding wires 141 and the second bonding wires 142. The external terminals 160 such as solder balls are disposed on the lower surface 112 of the substrate 110. In the foregoing conventional multi-chip package 100, the substrate 110 spends much toward the entire packaging cost and the area of that the first chip 120 is directly encapsulated by the molding compound 150 is small, so that it is subject to inner stress to result in delamination problem. Additionally, the higher the chips are superimposed in dislocation, the longer the bonding wires connecting the chip need.

A multi-chip package wire-bonding on single-side bonding pads of a chip has been disclosed in U.S. Pat. No. 6,498,391 (as same as R.O.C. Taiwan Patent No. 404,030), which typically utilizes a leadframe with asymmetric leads (one side has longer leads and another side has shorter leads in length) to carry two chips with single-side pads. The longer leads at one side of leadframe are interposed between two chips superimposed in dislocation and a molding compound formed with transfer molding method encapsulates the two chips and inner ends of the two-side asymmetric leads. According to characteristic and direction of mold-flow, a gap located in where the long side leads are interposed between two chips is unable to be filled completely, thus the bubbles existing in the gap will cause serious delamination and popcorn problems to lower product reliability.

SUMMARY OF THE INVENTION

In order to solve the problems mentioned above, the primary object of the present invention is to provide an IC package encapsulating a chip under asymmetric single-side leads, which may increase the encapsulated area of a chip wire-bonded at single-side by a molding compound and there is no bubble existing in the gap of the sandwiched long side leads to enhance product reliability of semiconductor package.

The secondary object of the present invention is to provide an IC package encapsulating a chip under asymmetric single-side leads to facilitate filling the gap inside the long side leads with molding compound without bubbles occurring between two chips to solve delamination or popcorn problems.

One aspect of the present invention provides an IC package encapsulating a chip under asymmetric single-side leads comprising a leadframe, a plurality of first die-attach tape strips, a first chip, at least a second chip, a plurality of first bonding wires, a plurality of second bonding wires and a molding compound. The leadframe is asymmetric and has a plurality of first side leads and a plurality of second side leads, wherein the first side leads are longer than the second side leads in length and the first side leads exceed a center line of the package. The first die-attach tape strips are mutually parallel and adhered on partial lower surfaces of the first side leads. The active surface of the first chip is adhered to the first die-attach tape strips, so that at least a mold-flow channel is formed through the first chip, the first side leads and the first die-adhered strips. A plurality of single-side pads are formed at one side of the active surface and are located at a non-central gap between the first side leads and the second side leads. The first bonding wires are applied to electrically connect the single-side pads to the first side leads and the second side leads. The backside of the second chip is attached onto the first side leads without covering the foregoing non-central gap. The second bonding wires are also applied to electrically connect the second chip to the first side leads and the second side leads. The molding compound encapsulates the first chip, the second chip, the first bonding wires, the second bonding wires and portions of the first side leads and portions of the second side leads, and fills up the mold-flow channel.

With respect to the IC package mentioned above, the mold-flow channel crosses a plurality of gaps between the first side leads.

With respect to the IC package mentioned above, it further comprises a plurality of second die-attach tape strips mutually parallel and adhered onto upper surfaces of the first side leads for attaching backside of the second chip.

With respect to the IC package mentioned above, the portions of the first side leads and the portions of the second side leads encapsulated by the molding compound are coplanar.

With respect to the IC package mentioned above, the second chip is substantially as same as the first chip and has a plurality of single-side pads.

With respect to the IC package mentioned above, the leadframe further comprises a plurality of third side leads and a plurality of fourth side leads that are located at the rest two laterals of the molding compound and shorter than the first side leads in length.

With respect to the IC package mentioned above, it further comprises a third chip disposed above the second chip.

With respect to the IC package mentioned above, the third chip is superimposed in dislocation on the second chip.

With respect to the IC package mentioned above, the third chip is substantially as same as the second chip and overlapped on the second chip.

With respect to the IC package mentioned above, an interposer is formed between the third chip and the second chip.

With respect to the IC package mentioned above, it further comprises a fourth chip disposed under the first chip.

With respect to the IC package mentioned above, the first and the second chips are chips wire-bonded to connect at single-side.

DETAILED DESCRIPTION OF THE INVENTION

Figure 1:
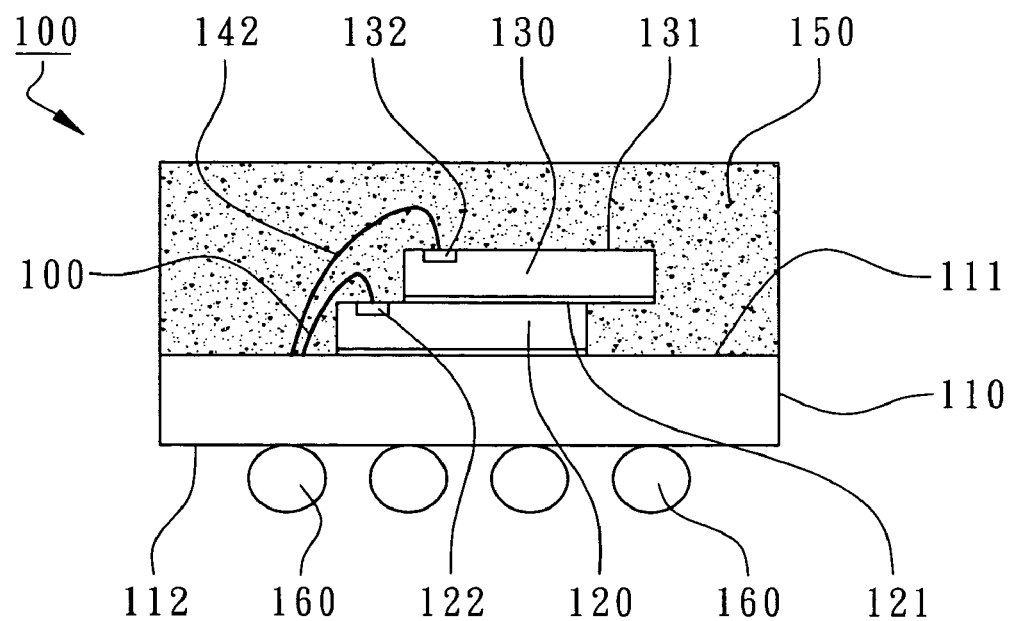
FIG. 1 is a cross-sectional view of a conventional multi-chip package.
Figure 2:
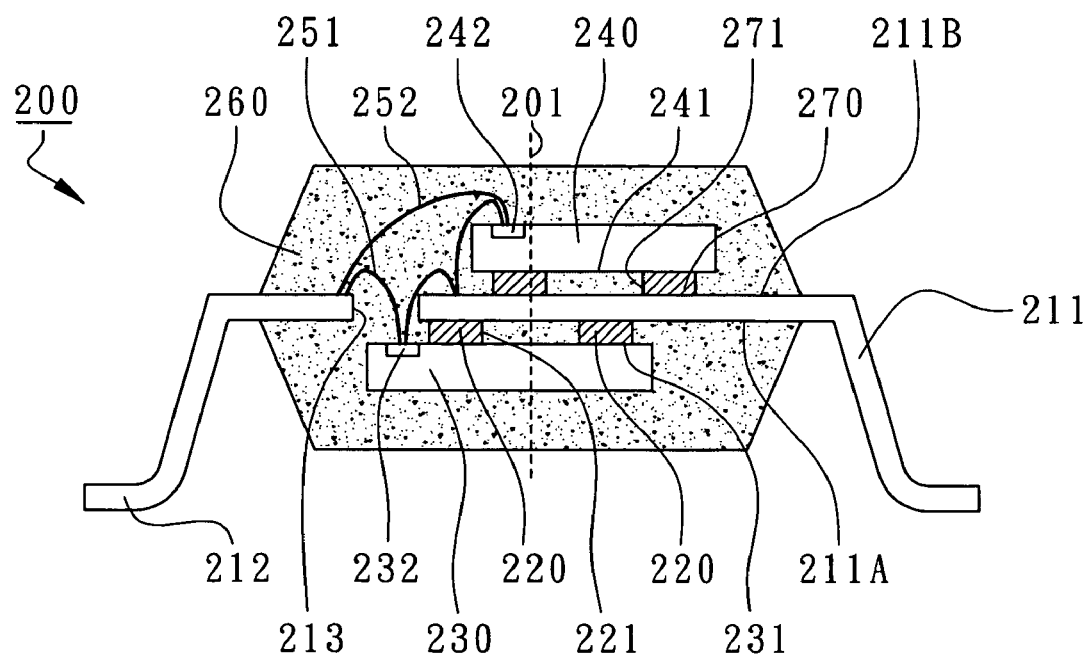
FIG. 2 is a cross-sectional view of an IC package in accordance with the first embodiment of the present invention.

An IC package encapsulating a chip under asymmetric single-side leads is disclosed in the first embodiment of the present invention. FIG. 2 shows a cross-sectional view of the IC package and FIG. 3 shows a plan view of a leadframe and a chip under the leadframe in the package.

Figure 3:
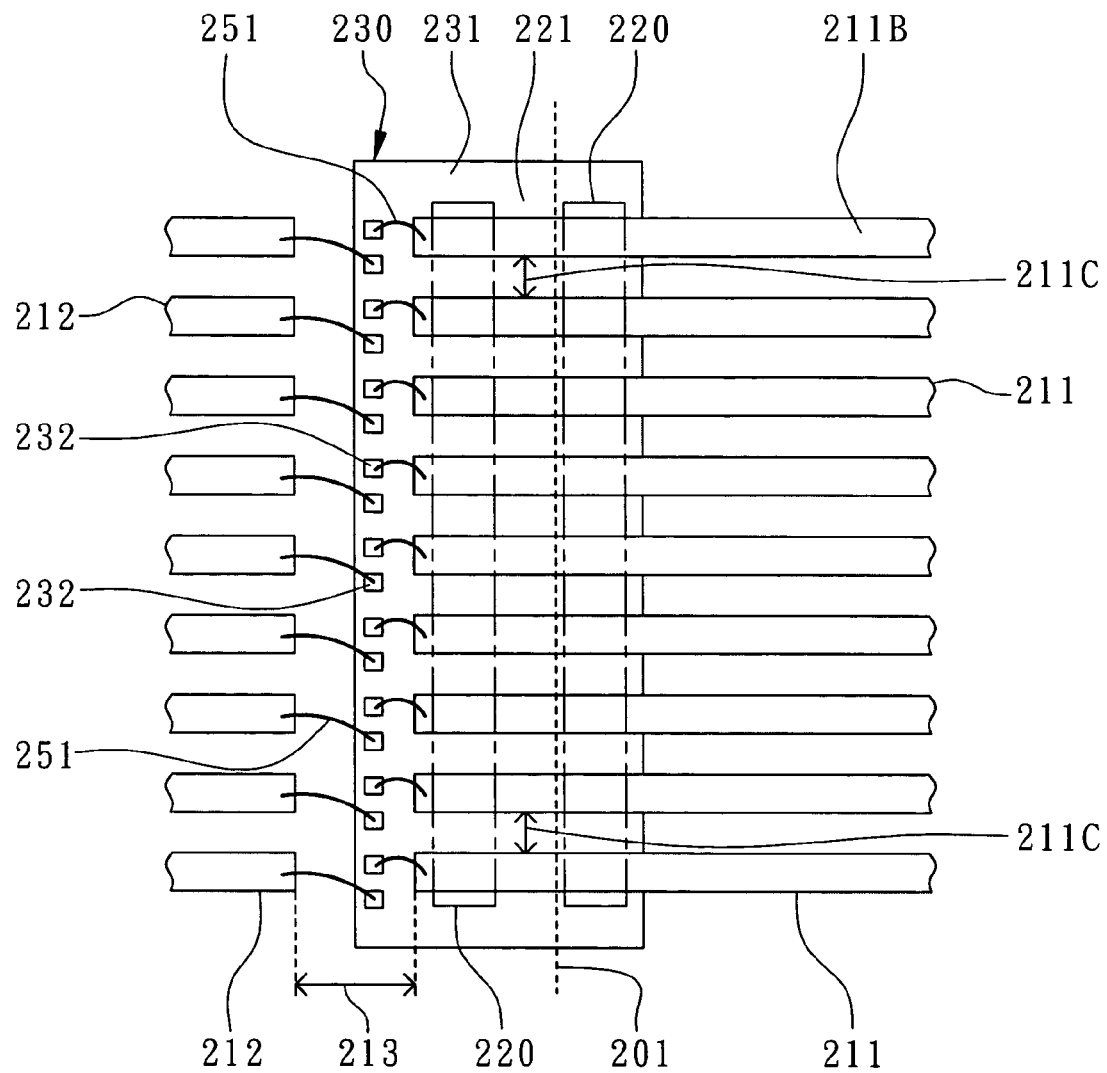
FIG. 3 is a plan view of a leadframe and a chip under the leadframe in the IC package in accordance with the first embodiment of the present invention.

Referring to FIG. 2 and FIG. 3, an IC package 200 encapsulates a chip under asymmetric single-side leads. The IC package 200 mainly comprises a plurality of first side leads 211 and a plurality of second side leads 212 of a leadframe, a plurality of first die-attach tape strips 220, a first chip 230, a plurality of first bonding wires 251, at least a second chip 240, a plurality of second bonding wires 252 and a molding compound 262. The first side leads 211 and the second side leads 212 are located at two corresponding laterals of the semiconductor package 200 and the first side leads 211 are longer than the second side leads 212 in length. Referring to FIG. 2, the first side leads 211 exceed a center line 201 of the package 200 in length to carry both the second chip 240 and the first chip 230.

The first die-attach tape strips 220 are mutually parallel and adhered onto the partial lower surfaces 211A of the first side leads 211. The active surface 231 of the first chip 230 is adhered to the first die-attach tape strips 220. Referring to FIG. 3, the first die-attach tape strips 220 are slender shape. Referring now to FIG. 2 and FIG. 3, a mold-flow channel 221 is formed through the first chip 230, the first side leads 211 and the first die-adhered strips 220. The width of the first die-adhered strips 220 may about be 100 μm.

Moreover, a plurality of single-side pads 233 are formed at one side of the active surface 231 of the first chip 230. In this embodiment, the single-side pads 233 are aligned and located at a non-central gap 213 between the first side leads 211 and the second side leads 212. The first bonding wires 251 are applied to electrically connect the single-side pads 233 to the first side leads 211 and the second side leads 212 through the non-central gap 213.

The backside 241 of the second chip 240 is attached onto the first side leads 211 without covering the foregoing non-central gap 213. In this embodiment, the second chip 240 is substantially as same as the first chip 230 and has a plurality of single-side pads 242. For example, the first chip 230 has a same size and same aligned single-side pads 242 with the second chip 240. The second bonding wires 252 are applied to electrically connect the single-side pads 242 of the second chip 240 to the first side leads 211 and the second side leads 212.

The molding compound 260 encapsulates the first chip 230, the second chip 240, the first bonding wires 251, the second bonding wires 252 and inner ends of the first side leads 211 and inner ends of the second side leads 212 and fills up the mold-flow channel 221, so that the encapsulated area of the first chip 230 encapsulated by the molding compound 260 may be increased to enhance product reliability of semiconductor package. Referring to FIG. 3, the mold-flow channel 221 desirably crosses a plurality of gaps 211C between the first side leads 211 and approximately as same as the mold-flow direction. An opening at one end of the mold-flow channel 221 may serve as a main compound injecting entrance. Another opening at another end of the mold-flow channel 221 and the gap 211C of the first side leads 211 may also serve as exhaust channels to enable the molding compound 260 to fill up the gap 211C of the first side leads 211 and the mold-flow channel 221, which can prevent the bubbles from occurring between the first chip 230 and the second chip 240 to solve delamination and popcorn problems.

It is desirable that the IC package 200 may further comprises a plurality of second die-attach tape strips 270 that are mutually parallel and adhered to a plurality of upper surfaces 211B of the first side leads 211 and the backside 241 of the second chip 240 to increase the quantity of mold-flow channel 221 and the encapsulated area of the second chip 240 encapsulated by the molding compound 260.

Besides, in this embodiment, the portions of that the first side leads 211 and the portions of the second side leads 212 encapsulated by the molding compound 260 are coplanar and have no sinkage and declination to obtain a mold-flow balance with low cost.

Figure 4:
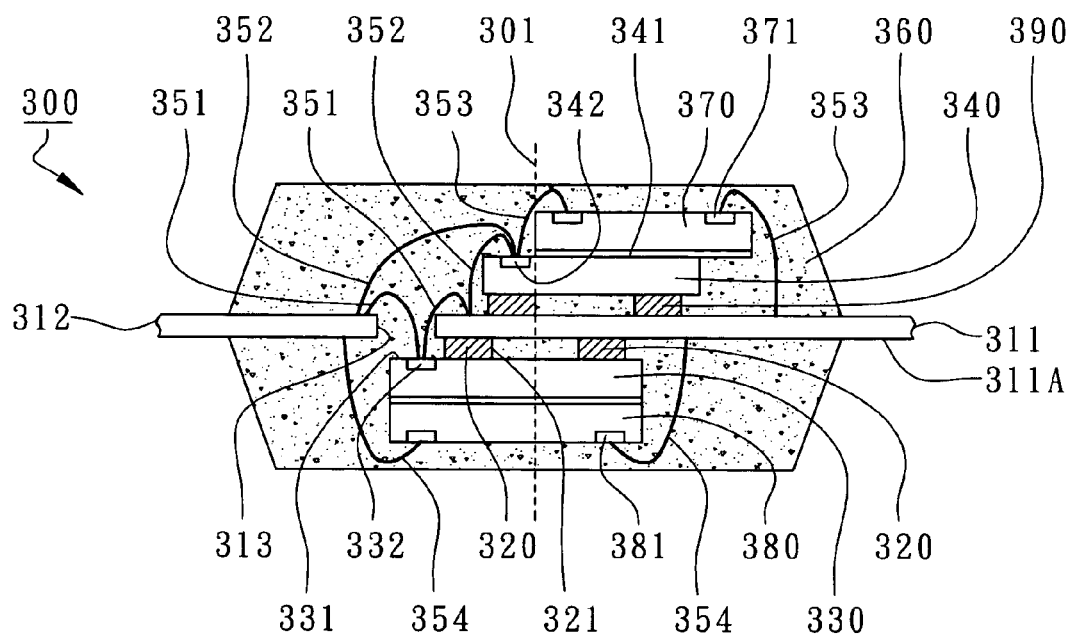
FIG. 4 is a cross-sectional view of another IC package in accordance with the second embodiment of the present invention.

Referring now to FIG. 4, another IC package 300 encapsulating a chip under asymmetric single-side leads is illustrated in accordance with the second embodiment of the present invention. The package 300 comprises a plurality of first side leads 311 and a plurality of second side leads 312 of a leadframe, a plurality of first die-attach tape strips 320, a first chip 330, a plurality of first bonding wires 351, at least a second chip 340, a plurality of second bonding wires 352 and a molding compound 360. The first side leads 311 are longer than the second side leads 312 and exceeds a center line 301. The first die-attach tape strips 320 are mutually parallel and adhered onto the partial lower surfaces 311A of the first side leads 311. The active surface 331 of the first chip 330 is adhered onto the first die-attach tape strips 320 and at least a mold-flow channel 321 is formed through the first chip 330, the first side leads 311 and the first die-attach tape strips 320. A plurality of single-side pads 332 are formed at one side of the active surface 331 of the first chip 330 and located at a non-central gap 313 between the first side leads 311 and the second side leads after die-adhesive process. The first bonding wires 351 are applied for electrically connecting the single-side pads 332 to the first side leads 311 and the second side leads 312. The backside 341 of the second chip 340 is attached onto the first side leads 311 via a plurality of second die-attach tape strips 390 without covering the foregoing non-central gap 313. Also, the second bonding wires 352 are applied for electrically connecting a plurality of single-side pads 342 on the second chip 340 to the first side leads 311 and the second side leads 312. The molding compound 360 encapsulates the first chip 330, the second chip 340, the first bonding wires 351, the second bonding wires 352 and portions of the first side leads 311 and portions of the second side leads 312 and fills up the mold-flow channel 321.

Moreover, in this embodiment, the IC package 300 may further comprises a third chip 370 disposed above the second chip 340, which the third chip 370 is superimposed in dislocation on the second chip 340 without covering the single-side pads 342 of the second chip 340. The third chip 370 also has a plurality of bonding pads 371 that are electrically connected to the first side leads 311 and the single-side pads 342 of the second chip 340 via a plurality of third bonding wires 353 and further to the second side leads 312 via the second bonding wires 352 serving as a data common carrier. In this embodiment, the IC package 300 may further comprises a fourth chip 380 disposed under the first chip 330, which the fourth chip 380 may be adhered onto the first chip 330 with back-to-back attachment. The fourth chip 380 also has a plurality of bonding pads 381 that are electrically connected to the first side leads 311 and the second side leads 312 via a plurality of fourth bonding wires 354.

Figure 5:
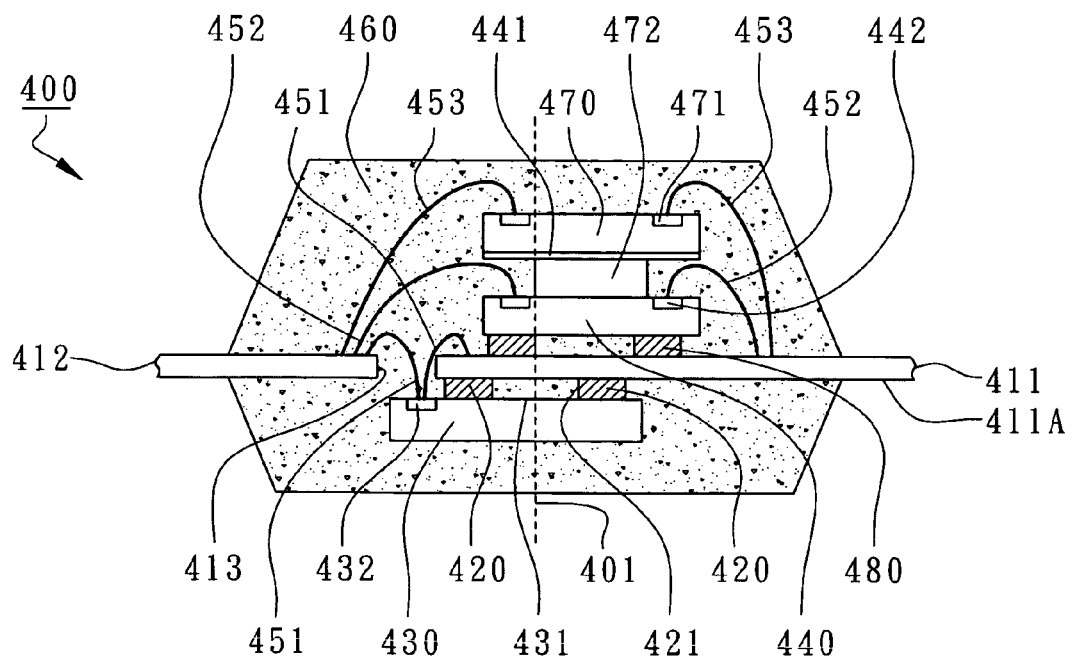
FIG. 5 is a cross-sectional view of another IC package in accordance with the third embodiment of the present invention.

In the third embodiment of the present invention, another IC package encapsulating chips under asymmetric single-side leads is disclosed. FIG. 5 shows a cross-sectional view of the package and FIG. 6 shows a plan view of a leadframe and the chips under the leadframe in the package.

Figure 6:
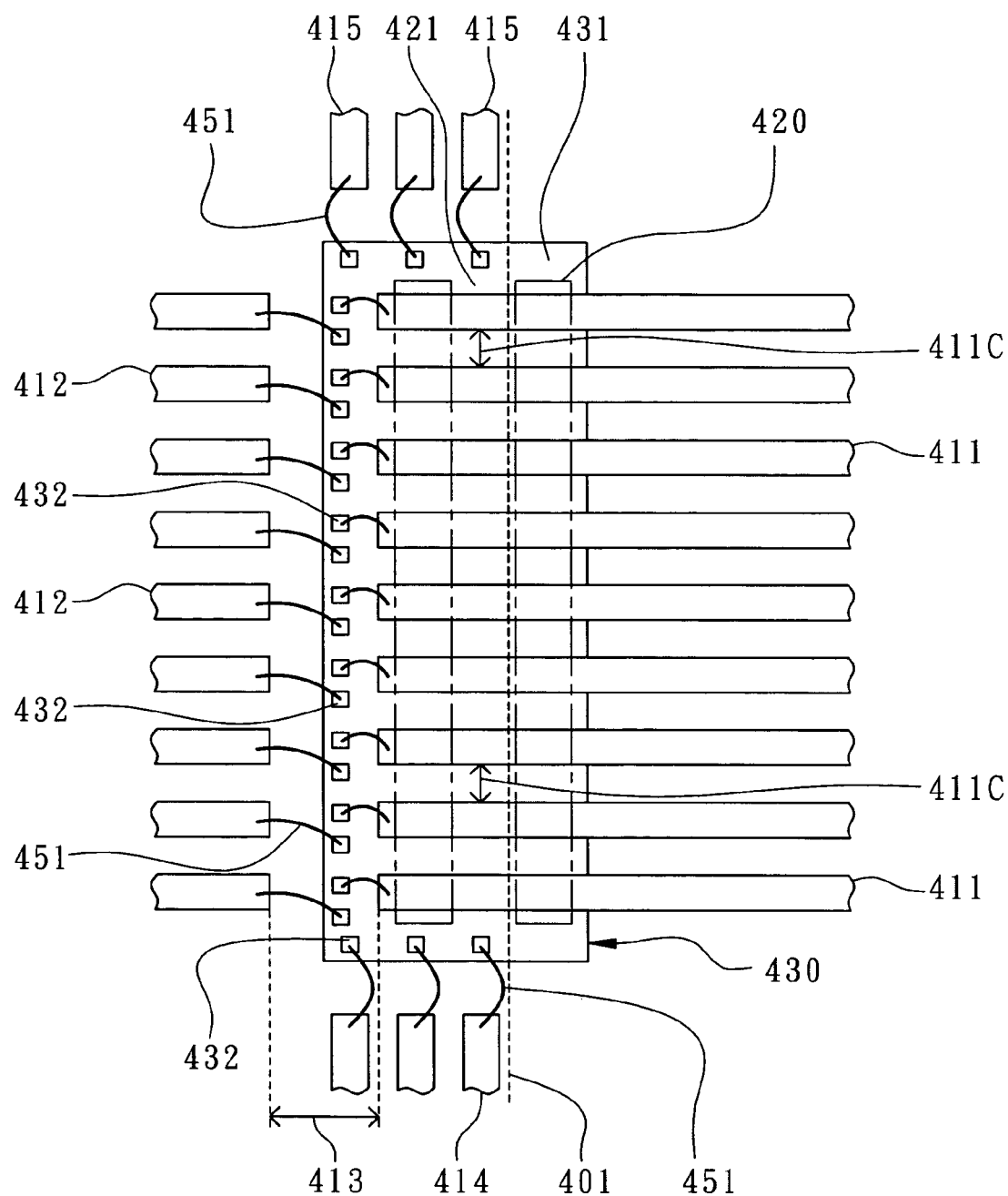
FIG. 6 is a plan view of a leadframe and a chip under the leadframe in the IC package in accordance with the third embodiment of the present invention.

Referring to FIG. 5 and FIG. 6, an IC package 400 encapsulating chips under asymmetric single-side leads, mainly comprises a plurality of first side leads 411 and a plurality of second side leads 412 of a leadframe, a plurality of first die-attach tape strips 420, a first chip 430, a plurality of first bonding wires 451, at least a second chips 440, a plurality of second bonding wires 452 and a molding compound 460. The length of the first side leads 411 is asymmetric to and longer than that of the second side leads 412 and exceeds a center line 401. The first die-attach tape strips 420 are mutually parallel and adhered onto the partial lower surfaces 411A of the first side leads 411. The active surface 431 of the first chip 430 is adhered onto the first die-attach tape strips 420. Additionally, there is at least a mold-flow channel 421 formed through the first chip 430, the first side leads 411 and the first die-attach tape strips 420. A plurality of single-side pads 432 are formed at one side of the active surface 431 of the first chip 430 and located at a non-central gap 413 between the first side leads 411 and the second side leads 412. The first bonding wires 451 are applied for electrically connecting the single-side pads 432 to the first side leads 411 and the second side leads 412. The backside 441 of the second chip 440 is attached onto the first side leads 411 via a plurality of second die-attach tape strips 480 without covering the foregoing non-central gap 413. The second bonding wires 452 are also applied for electrically connecting a plurality of bonding pads 442 on the second chip 440 to the first side leads 411 and the second side leads 412. The molding compound 460 encapsulates the first chip 430, the second chip 440, the first bonding wires 451, the second bonding wires 452, portions of the first side leads 411 and portions of the second side leads 412 and fills up the mold-flow channel 421. The mold-flow channel 421 desirably crosses a plurality of gaps 411C (as showed in FIG. 6) between the first side leads 411 to enable the molding compound 460 to fill up the gap 411C of the first side leads 411, that can prevent bubbles from occurring between the superimposed chips in dislocation that are wire-bonded at single-side to result in delamination or popcorn problems.

In this embodiment, a third chip 470 is further disposed above the second chip 440, which has a plurality of bonding pads 471 electrically connected to the first side leads 411 and the second side leads 412 via a plurality of third bonding wires 453. An interposer 472 may be formed between the third chip 470 and the second chip 440 allowing the third chip 470 to be overlapped on the second chip 440 without touching the second bonding wires 452.

In this embodiment as showed in FIG. 6, the bonding pads 432 on the first chip 430 are asymmetrically ranged in "U" shape and the leadframe further has a plurality of third side leads 414 and a plurality of fourth side leads 415 that are located at the rest two laterals of the molding compound 460 and shorter than the first side leads 411 in length. The partial first bonding wires 451 are also applied for electrically connecting the short side pads 432 to the third side leads 414 and the fourth side leads 415.

Figure 7:
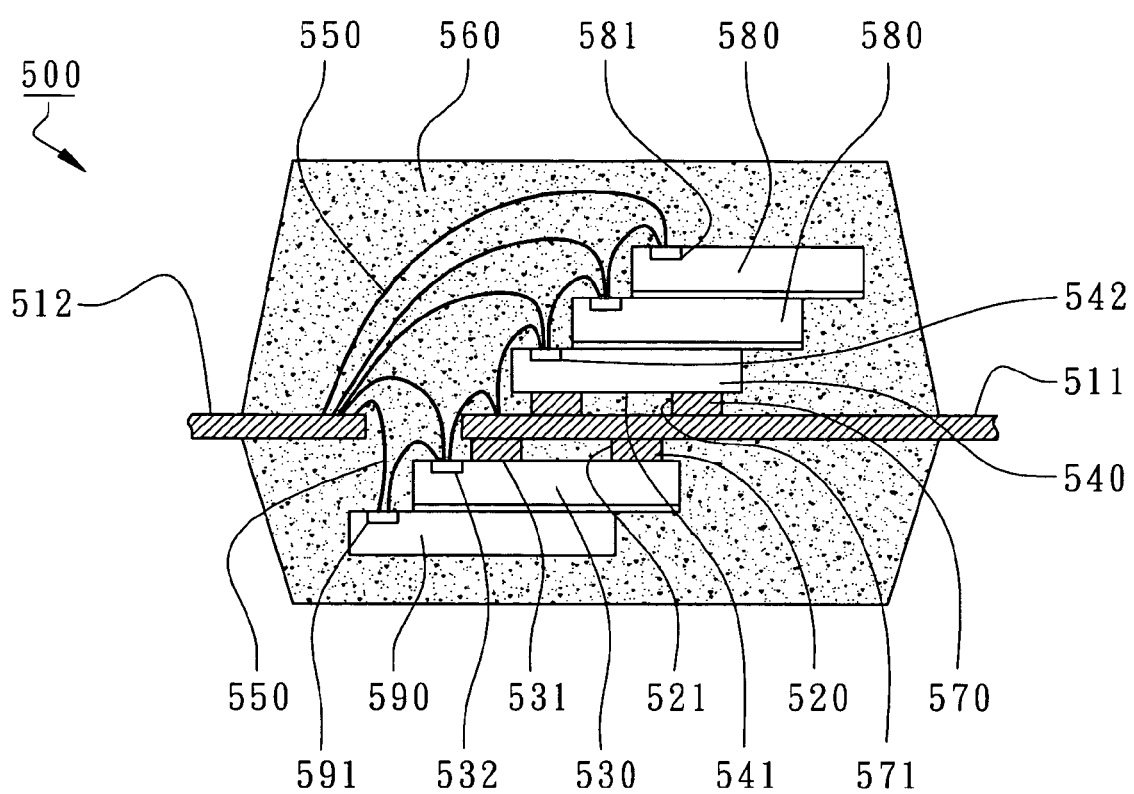
FIG. 7 is a cross-sectional view of another IC package in accordance with the fourth embodiment of the present invention.

The present invention also discloses another multi-chip package. As showed in FIG. 7, an IC package 500 encapsulating chips under asymmetric single-side leads, comprises a plurality of first side leads 511 and a plurality of second side leads 512 of a leadframe, a plurality of first die-attach tape strips 520, a first chip 530, a second chip 540, a plurality of bonding wires 550 and a molding compound 560. The length of the first side leads 511 is asymmetric to and longer than that of the second side leads 512. The first die-attach tape strips 520 are mutually parallel and adhered onto the partial lower surfaces of the first side leads 511. The active surface 531 of the first chip 530 is adhered onto the first die-attach tape strips 520 so that at least a mold-flow channel 521 is formed through the first chip 530, the first side leads 511 and the first die-attach tape strips 520. In addition, the backside 541 of the second chip 540 is attached onto the first side leads 511 and it is able to utilize a plurality of second die-attach tape strips 570 ranged in parallel to adhere the second chip 540 to create more mold-flow channels. Likewise, at least another mold-flow channel 571 is formed through the second chip 540, the first side leads 511 and the second die-attach tape strips 570. In this embodiment, both the first chip 530 and the second chip 540 are chips wire-bonded to connect at single-side. The bonding wires 550 are applied for electrically connecting the single-side leads 532, 542 of the first chip 530 and the second chip 540 to the first side leads 511 and the second side leads 512. The molding compound 560 encapsulates the first chip 530, the second chip 540, the bonding wires 550 and portions of the first side leads 511 and portions of the second side leads 512 and fills up the mold-flow channels 521, 571. Moreover, the package 500 may further comprises at least a third chip 580 having a plurality of single-side pads 581 above the second chip 540 and may further comprises at least a fourth chip 590 having a plurality of single-side pads 591 under the first chip 530. In this embodiment, all the chips 530, 540, 580, 590 may be a same chip that is wire-bonded at single-side and superimposed in dislocation and obliquity, so that they can be electrically connected to the leads 511, 512 via the bonding wires 550.

While the present invention has been particularly illustrated and described in detail with respect to the preferred embodiments thereof, it will be clearly understood by those skilled in the art that various changed in form and details may be made without departing from the spirit and scope of the present invention.

What is claimed is:

1. An IC package comprising:
a plurality of first side leads and a plurality of second side leads of a leadframe, wherein the first side leads are longer than the second side leads and exceed a center line of the package;
a plurality of first die-attach tape strips mutually parallel and adhered onto a plurality of lower surfaces of the first side leads;
a first chip having an active surface adhered onto the first die-attach tape strips, wherein at least a mold-flow channel is formed through the first chip, the first side leads and the first die-attach tape strips, wherein the first chip has a plurality of single-side pads formed at one side of the active surface and located at a non-central gap between the first side leads and the second side leads;
a plurality of first bonding wires electrically connecting the single-side pads to the first side leads and the second side leads;
at least a second chip having a backside attached onto the first side leads without covering the non-central gap;
a plurality of second bonding wires electrically connecting the second chip to the first side leads and the second side leads; and
a molding compound encapsulating the first chip, the second chip, the first bonding wires, the second bonding wires and portions of the first side leads and portions of the second side leads and filling up the mold-flow channel.

2. The IC package in accordance with claim 1, wherein the mold-flow channel crosses a plurality of gaps between the first side leads.

3. The IC package in accordance with claim 1, further comprising a plurality of second die-attach tape strips mutually parallel and adhered onto a plurality of upper surfaces of the first side leads for attaching the backside of the second chip.

4. The IC package in accordance with claim 1, wherein the portions of the first side leads and the portions of the second side leads encapsulated by the molding compound are coplanar.

5. The IC package in accordance with claim 1, wherein the second chip is substantially as same as the first chip and also has a plurality of single-side pads.

6. The IC package in accordance with claim 1, wherein the leadframe further has a plurality of third side leads and a plurality of fourth side leads that are located at the rest two laterals of the molding compound and shorter than the first side leads in length.

7. The IC package in accordance with claim 1, further comprising a third chip disposed above the second chip.

8. The IC package in accordance with claim 7, wherein the third chip is superimposed in dislocation on the second chip.

9. The IC package in accordance with claim 7, wherein the third chip is substantially as same as the second chip and overlapped on the second chip.

10. The IC package in accordance with claim 9, further comprising an interposer formed between the third chip and the second chip.

11. The IC package in accordance with claim 7, further comprising a fourth chip disposed under the first chip.

12. The IC package in accordance with claim 1, wherein both the first chip and the second chip are chips having a plurality of single-side pads at only one side for wire bonding.

* * * * *